US011264940B2

(12) United States Patent
Townley et al.

(10) Patent No.: US 11,264,940 B2
(45) Date of Patent: Mar. 1, 2022

(54) ROLLER SHADE WITH SOLAR CELLS

(71) Applicant: LEAR CORPORATION, Southfield, MI (US)

(72) Inventors: Lisa Townley, Allen Park, MI (US); Paul S. Severinski, Brownstown, MI (US); Larry Francis Kocher, Canton, MI (US); Travis Peterson, Southfield, MI (US); Michael Hans, Novi, MI (US)

(73) Assignee: LEAR CORPORATION, Southfield, MI (US)

( * ) Notice: Subject to any disclaimer, the term of this patent is extended or adjusted under 35 U.S.C. 154(b) by 73 days.

(21) Appl. No.: 16/901,215

(22) Filed: Jun. 15, 2020

(65) Prior Publication Data

US 2021/0391822 A1    Dec. 16, 2021

(51) Int. Cl.
*H02S 20/30* (2014.01)
*H01L 31/0747* (2012.01)
*B60L 1/10* (2006.01)
*H02S 40/38* (2014.01)
(Continued)

(52) U.S. Cl.
CPC .............. *H02S 20/30* (2014.12); *B60L 1/10* (2013.01); *B60L 53/51* (2019.02); *H01L 31/0747* (2013.01); *H02S 40/34* (2014.12); *H02S 40/38* (2014.12)

(58) Field of Classification Search
CPC ..................................................... B60L 53/51
See application file for complete search history.

(56) References Cited

U.S. PATENT DOCUMENTS 6,155,635 A * 12/2000 Wecker .................... B60J 7/003
                                                          296/211
6,423,894 B1 * 7/2002 Patz ........................... B60J 7/00
                                                          136/244
(Continued)

FOREIGN PATENT DOCUMENTS

CN       200977894          11/2007
CN       200977894 Y  *     11/2007
(Continued)

OTHER PUBLICATIONS

English machine translation of Lin (CN 200977894 Y) provided by the EPO website. (Year: 2021).*

*Primary Examiner* — Daniel P Malley, Jr.
(74) *Attorney, Agent, or Firm* — Brooks Kushman, P.C.

(57) ABSTRACT

A solar collector includes a roller rotatably attached to a vehicle. A carrier fabric panel is attached on one end to the roller. Side guides are attached the sides of the carrier fabric panel. Solar cells are connected in series and are attached to the carrier fabric panel. The solar cells are connected to an electrical power storage system. Electrical leads are attached to the carrier fabric and electrically coupled to the solar cells. Electrical conductors are attached to the carrier fabric between the solar cells and the right and left guides or are provided with retainer strips. A slip ring connector is disposed on the roller for electrically coupling the electrical conductors to an electrical power storage system. The solar energy collected may be used to power actuatable accessories or passive systems that may draw power when the vehicle is not being operated.

20 Claims, 9 Drawing Sheets

(51) Int. Cl.
*B60L 53/51* (2019.01)
*H02S 40/34* (2014.01)

(56) References Cited

U.S. PATENT DOCUMENTS

| | | | | |
|---|---|---|---|---|
| 6,631,943 | B2* | 10/2003 | Muller | B60J 7/0015 |
| | | | | 296/211 |
| 2016/0126886 | A1* | 5/2016 | Eo | B60K 16/00 |
| | | | | 296/216.04 |
| 2016/0200185 | A1* | 7/2016 | Lichowski | B60J 11/02 |
| | | | | 150/166 |
| 2017/0217321 | A1* | 8/2017 | Sekiya | H02S 10/40 |
| 2021/0006199 | A1* | 1/2021 | Kim | B60R 9/00 |

FOREIGN PATENT DOCUMENTS

| | | |
|---|---|---|
| DE | 19850296 | 8/2002 |
| DE | 102009009242 | 8/2010 |
| DE | 102010007505 | 8/2011 |

* cited by examiner

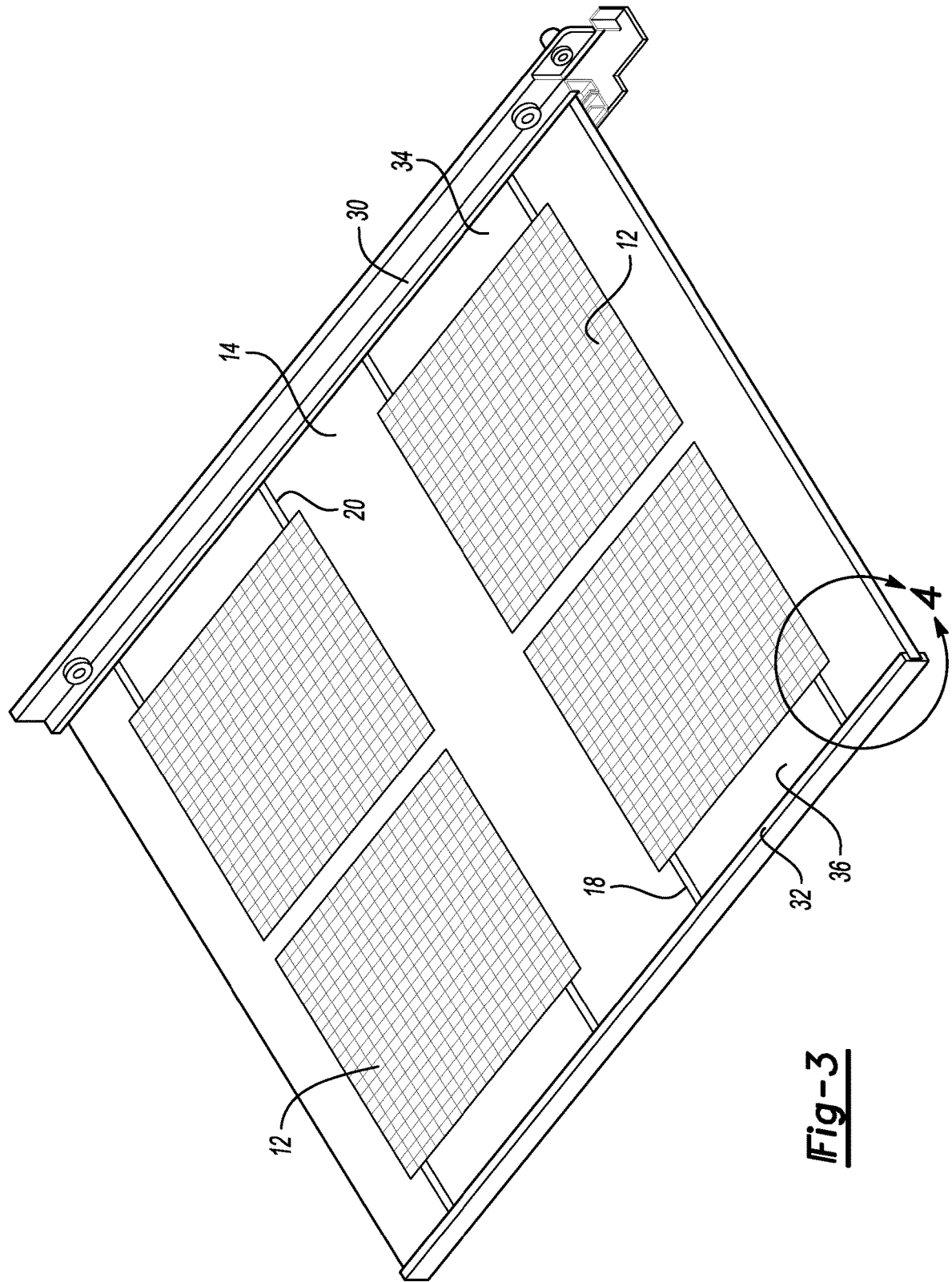

ROLLER SHADE WITH SOLAR CELLS

TECHNICAL FIELD

This disclosure relates to a roller shade for electric vehicles that is extended to collect energy and retracted onto a roller when not collecting energy to allow sunlight into the vehicle interior.

BACKGROUND

Solar cells collect energy from sunlight and convert the solar energy into electric power. Solar cells may use crystalline silicon or amorphous silicon with amorphous silicon being generally thinner and more flexible than crystalline silicon. Solar cells must be connected to a battery or other energy storage medium but rolling up the carrier fabric on a crossbar creates an issue relating to the robustness of the solar cells and connections of the solar cells to vehicle systems. Conductors for connecting the solar cells to vehicle systems must be flexible and maintain effective connections when the roller shade is extended or retracted. The thickness of the solar cells, conductors and the carrier panel in the prior art required substantial packaging space to house the roller shade in a housing when retracted.

An important objective for electric vehicles is to conserve battery power by minimizing current drawn by accessories. One problem facing electric vehicles is "vampire drain" that is caused by the constant drain on the battery from vehicle systems when a vehicle is parked for an extended period of time. Many accessories draw a small amount of current, e.g. 1 milliamp, when the vehicle is shutdown. However, the number of different systems and accessories that draw current, in combination, can drain the battery over time. If the battery is drained, door locks will be disabled, the vehicle will not start, anti-theft systems may become disabled, and other systems will be inoperable.

This disclosure is directed to solving the above problems and other problems as summarized below.

SUMMARY

According to one aspect of this disclosure, a roller shade solar collector is disclosed for a vehicle that comprises a roller rotatably attached to the vehicle and a carrier fabric panel attached on one end to the roller. Right and left guides are attached to right and left sides of the carrier fabric panel. A plurality of solar cells is connected in series and attached to the carrier fabric panel. The solar cells are connected to an electrical power storage system. Electrical leads are attached to the carrier fabric and electrically coupled to the solar cells. Electrical conductors are provided with at least one of the right and left guides, and at least one connector electrically couples the electrical conductors to the electrical power storage system. The connector may be a slip ring connector.

According to other aspects of this disclosure, the conductors may be thin film busbars disposed within at least one of the right and left guides. The conductors may be wires embedded in at least one of the right and left guides. In another embodiment, the conductors may be thin film bus bars attached to an outer surface of at least one of the right and left guides. The conductors may also be provided as conductive material adhered to or printed on an outer surface of at least one of the right and left guides.

The roller may be a tube having an outer diameter of between 12 and 20 mm. The roller may be contained in a housing that is attached to the vehicle. According to another aspect of this disclosure, the solar cells may be amorphous silicon solar cells contained in a lamination that have a thickness of between 0.05 mm and 0.5 mm.

The electrical power storage system may operate independently of a propulsion battery of the vehicle.

According to another aspect of this disclosure, a roller shade solar collector is disclosed for a vehicle comprises a roller rotatably attached to the vehicle and a carrier fabric panel attached on one end to the roller. Right and left guides are attached to right and left sides of the carrier fabric panel. A plurality of solar cells is connected in series and attached to the carrier fabric panel. The solar cells are connected to an electrical power storage system provided on the vehicle. Electrical leads are attached to the carrier fabric and electrically coupled to the solar cells. Electrical conductors are attached to the carrier fabric between the solar cells and at least one of the right and left guides. An electrical power storage system provided on the vehicle, and at least one connector is disposed on the roller for the electrically coupling the electrical conductors to the electrical power storage system.

According to other aspects of this disclosure, the electrical leads and the electrical conductors may be thin film busbars having a flat cross section that are attached to a top surface of the carrier fabric panel. Alternatively, the electrical leads and the electrical conductors a may be made of a conductive polymer that is adhered to the carrier fabric panel.

The at least one connector may be a slip ring connector having a first portion fixed to the roller and a second portion fixed to the vehicle.

The electrical power storage system may be adapted to provide power to selected accessories when the vehicle is parked.

According to a further aspect of this disclosure, a vehicle is disclosed that includes a roof disposed above a passenger compartment of the vehicle and a light transmissive panel forming part of the roof. A roller is rotatably attached to the roof and a carrier fabric panel is attached on one end to the roller. The carrier fabric panel has an extended position, wherein the carrier fabric is deployed below the light transmissive panel and a retracted position wherein the carrier fabric panel is rolled around the roller. A plurality of solar cells is included in the at least one laminated solar panel that is attached to the carrier fabric. Electrical conductors are attached to the carrier fabric and electrically coupled to the at least one laminated solar panel. An electrical power storage system is provided on the vehicle and connectors electrically couple the electrical conductors to the electrical power storage system.

According to other aspects of this disclosure as it relates to a vehicle, the electrical power storage system may include a controller and a door lock system. The controller may be operatively connected to the electrical power storage system and the door lock system to provide power collected in the electrical power storage pack to the door lock system when the state of charge of the electrical power storage system is above a predetermined level.

According to another aspect of this disclosure as it relates to a vehicle, the electrical power storage system may include a controller and a security system. The controller may be operatively connected to the storage pack and the security system to provide power collected in the electrical power storage system to the security system when the state of charge of the electrical power storage system is above a predetermined level.

According to a further aspect of this disclosure as it relates to a vehicle, the electrical power storage system may include a controller a seat thermal management system. The controller may be operatively connected to the storage system and the seat thermal management system to provide power collected in the electrical power storage pack to the seat thermal management system when the state of charge of the electrical power storage system is above a predetermined level.

The vehicle may include a propulsion battery, a controller, and a DC/DC converter operatively connected to the electrical power storage system that selectively provides power to the propulsion battery of the vehicle when the state of charge of the electrical power storage system is above a predetermined level.

The above aspects of this disclosure and other aspects will be described below with reference to the attached drawings.

BRIEF DESCRIPTION OF THE DRAWINGS

FIG. 3 is a perspective view of four laminated solar panels attached to a carrier panel that is supported by right and left side guide tracks.

DETAILED DESCRIPTION

The illustrated embodiments are disclosed with reference to the drawings. However, it is to be understood that the disclosed embodiments are intended to be merely examples that may be embodied in various and alternative forms. The figures are not necessarily to scale and some features may be exaggerated or minimized to show details of particular components. The specific structural and functional details disclosed are not to be interpreted as limiting, but as a representative basis for teaching one skilled in the art how to practice the disclosed concepts.

Figure 1:
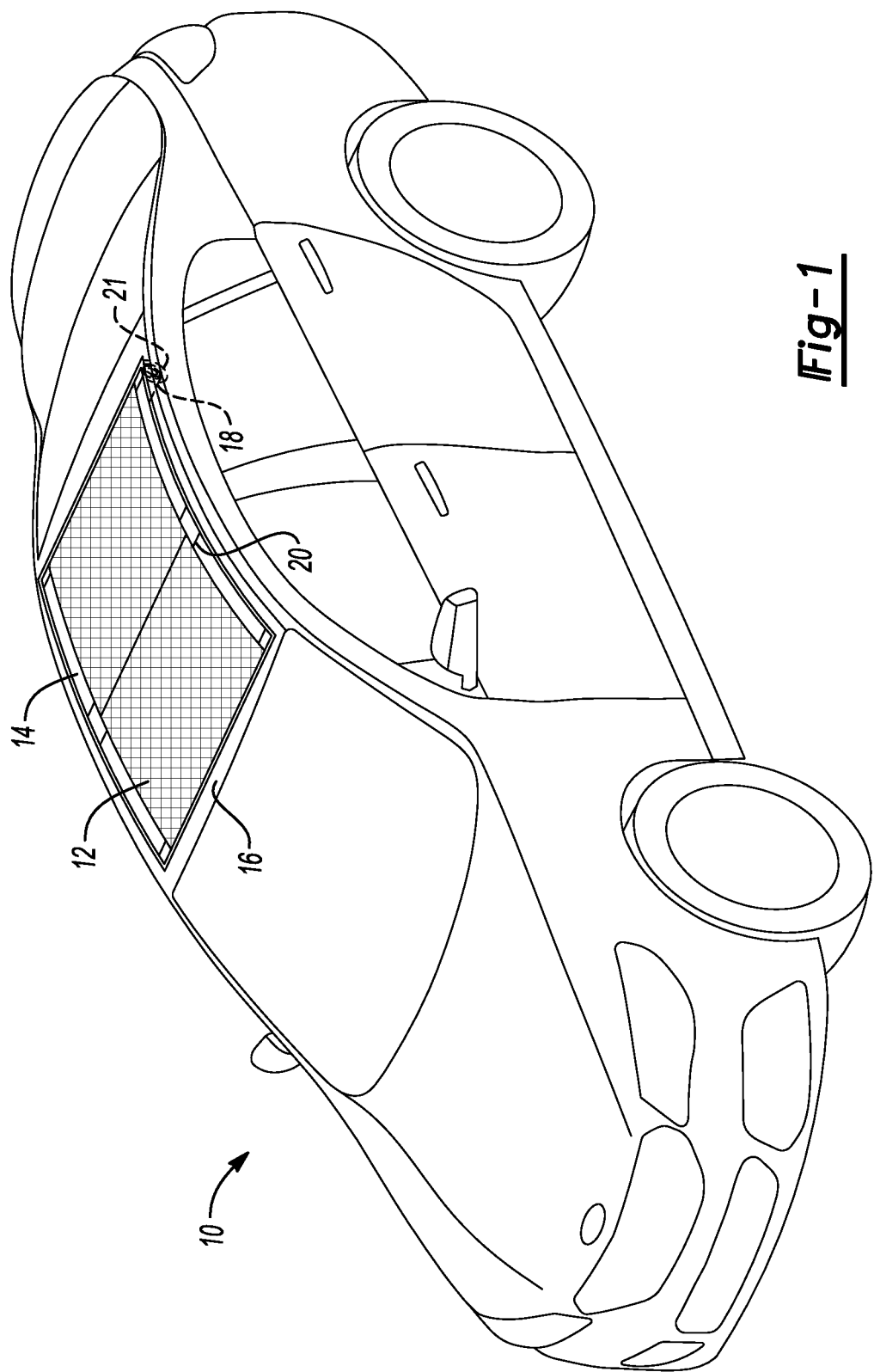
FIG. 1 is a perspective view of a vehicle having a plurality of laminated solar panels disposed below a light transmissive panel of the roof.

Referring to FIG. 1, a vehicle 10, such as an electric vehicle, is illustrated that includes a plurality of solar panels 12 attached to a carrier fabric material below a roof 16. The roof 16 includes a light transmissive panel 28 (shown in FIG. 2) such as a sunroof that may be fixed or movable as is well known in the art. A take-up roller 18 is attached below the roof in a housing 21 located near the rear edge of the light transmissive panel 28. Electrical leads 20 are provided on the carrier fabric material 14 that conduct current from the solar panels 12 to an energy storage device, such as a battery or capacitor system. The laminated structure is assembled to the vehicle below the light transmissive panel 28 that protects the solar panels 12.

Figure 2:
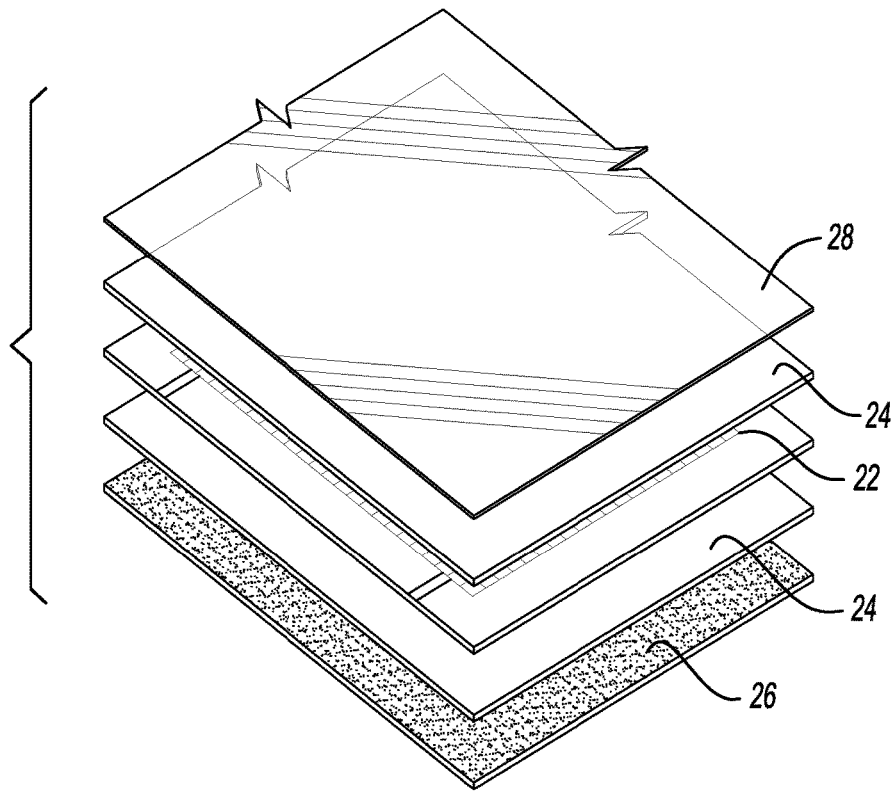
FIG. 2 is an exploded, fragmentary perspective view of a laminated solar panel.

Referring to FIG. 2, one example of a solar panel 12 is illustrated that is a laminated structure including a layer of photovoltaic cells 22, such as amorphous silicon solar cells, that is laminated between an upper layer and a lower layer of encapsulation material 24. The photovoltaic cells 22 and encapsulation material 24 are supported by a backing sheet 26. Other layers may be provided in the laminated structure such as adhesive layers, and the like.

Referring to FIG. 3, the solar panels 12 are shown attached to the carrier fabric material 14. The carrier fabric material 14 is supported between a right guide track 30 and a left guide track 32. A retainer strip 38 attached to a right side 34 of the carrier fabric material is received in the right guide track 30 and another retainer strip 38 attached to a left side 36 of the carrier fabric material is received in the left guide track 32. The leads 20 are attached to the solar panels 12 and the carrier fabric material 14 to conduct current from the solar panels 12.

Figure 4:
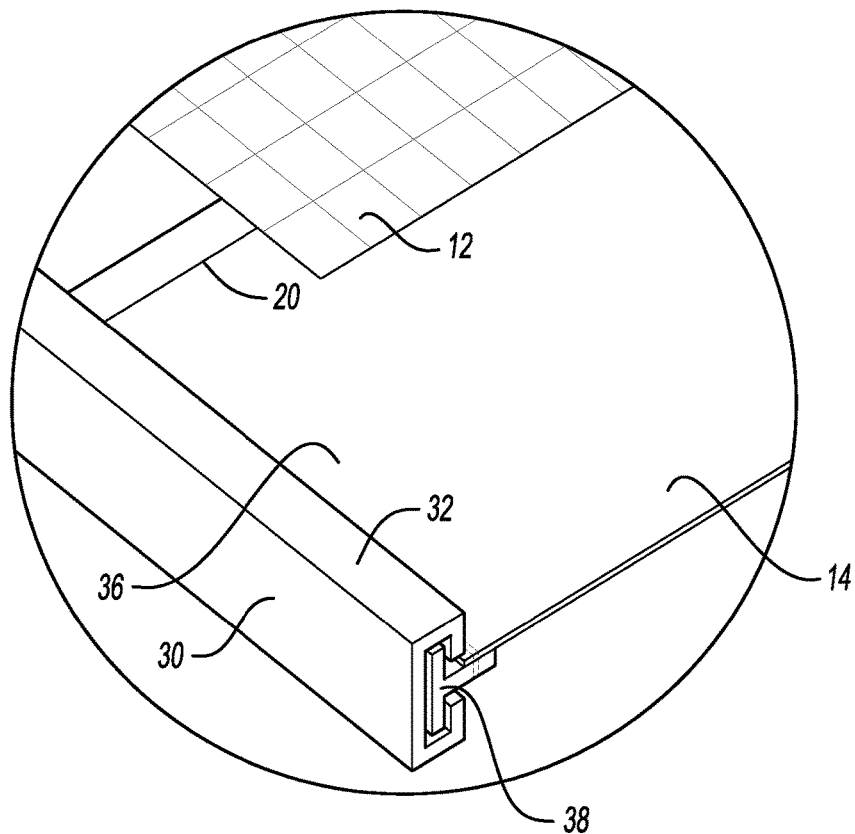
FIG. 4 is a magnified view of the portion shown in the circled area in FIG. 3.

Referring to FIG. 4, the carrier fabric material 14 is shown to be attached to the retainer strip 38 by stitching or by an ultrasonic weld. The retainer strip 38 is shown to be received within the left guide track 32. It should be understood that another retainer strip 38 is provided on the right side 34 of the carrier fabric material 14 that is received in the right guide track 30. The retainer strip 38 as shown has a T-shaped transverse cross section to prevent removal of the retainer strip 38. Other types of retainer strip configurations may be used that may be L-shaped or bulbous and perform the same function of retaining the carrier fabric material 14 in the guide tracks 30 and 32.

Figure 5:
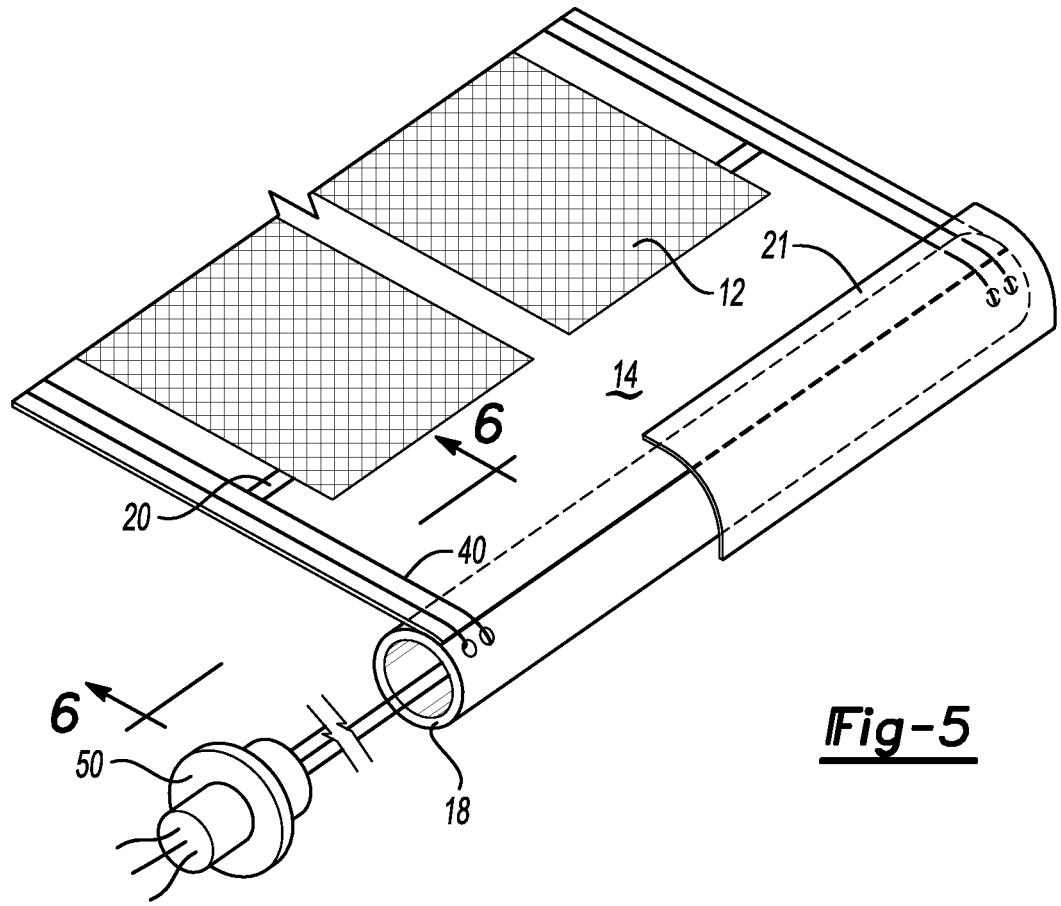
FIG. 5 is a fragmentary perspective view of one embodiment of the roller shade solar collector and take-up roller.
Figure 6:
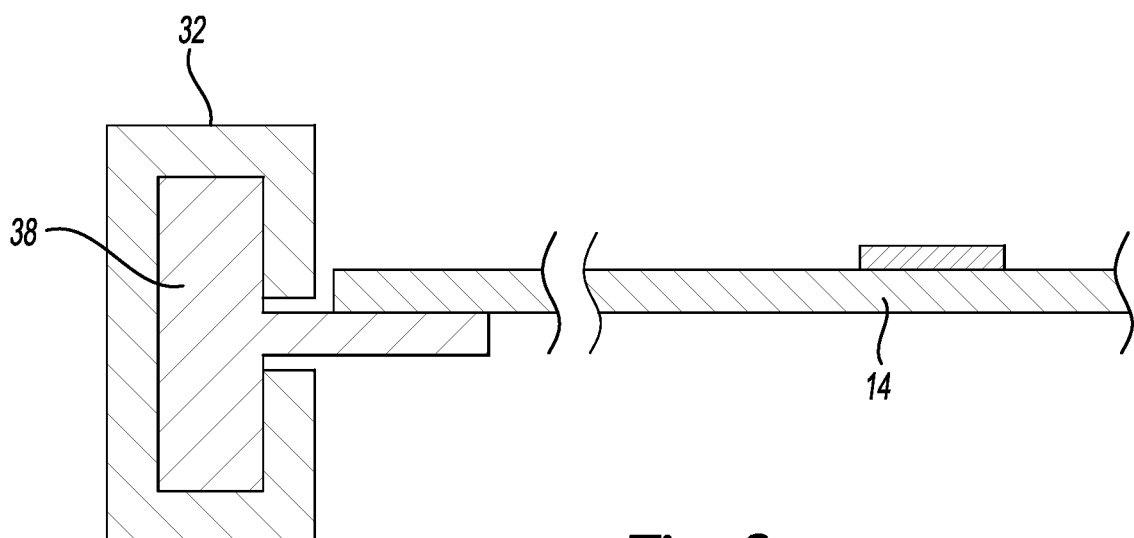
FIG. 6 is a cross section view taken along the line 6-6 in FIG. 5.

Referring to FIGS. 5 and 6, the carrier fabric material 14 with the attached solar panels 12 is shown secured to the take-up roller 18. The carrier fabric material 14 is retained by the left guide track 32 that receives the retainer strip 38. The carrier fabric material 14 is similarly retained on the right side thereof. Leads 20 are electrically connected to flat conductors 40 that are attached to the carrier fabric material 14. The flat conductors 40 may be a flat wire or a thin film busbar. The flat conductors 40 may be sewn, ultrasonically welded, or otherwise attached to the carrier fabric material 14. The thickness of the flat conductors 40 should be less than 0.5 mm and greater than 0.05 mm to allow the carrier fabric material 14 including the solar panels 12 and the flat wire conductors 40 to be rolled around the take-up roller 18 inside the housing 21. The conductors 40 are connected through a hole 48 defined by the roller 18 to the slip ring connector 50 that is partially disposed inside the roller 18.

Figure 7:
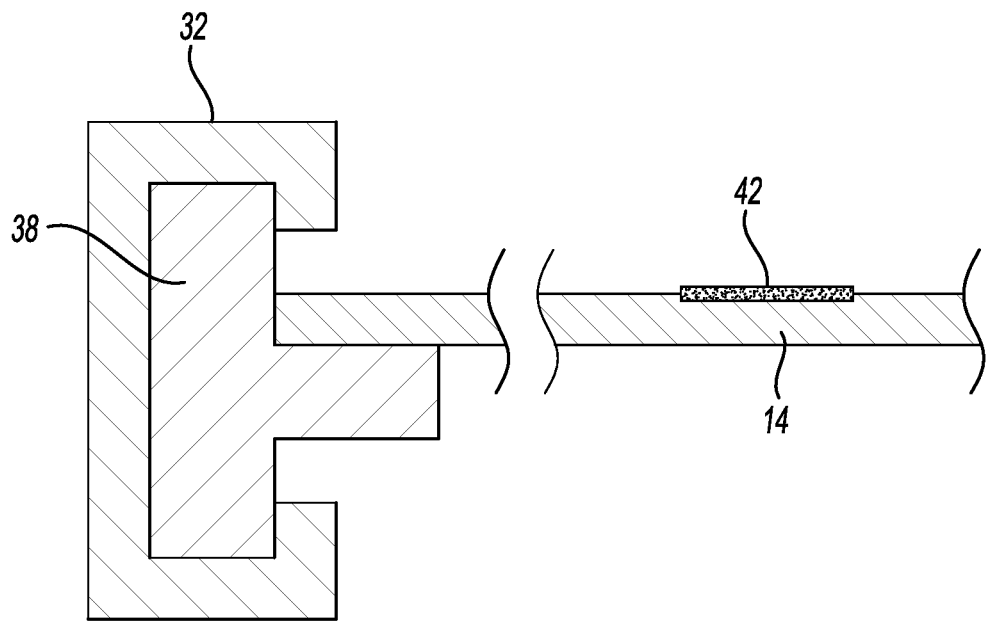
FIG. 7 is a cross section view like FIG. 6 showing a conductive coating applied to the carrier fabric.

Referring to FIG. 7, another embodiment is disclosed that is substantially similar to the embodiment of FIGS. 5 and 6 but instead of the flat conductor 40, a conductive coating 42 is applied to the carrier fabric material 14. The conductive coating 42 may be electrically conductive ink, an electrically conductive polymer coating, or metal coating, or a combination of such materials.

Figure 8:
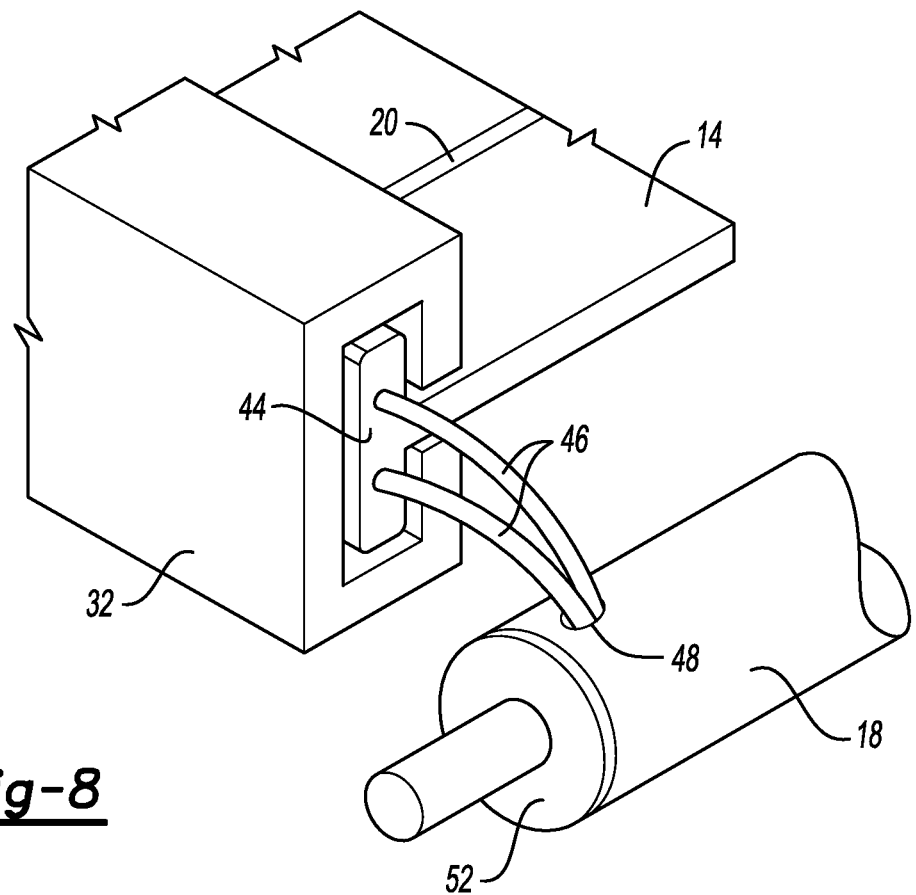
FIG. 8 is a fragmentary perspective view showing a retainer strip having a pair of wires enclosed within the retainer strip.

Referring to FIG. 8, another alternative embodiment is disclosed wherein the carrier fabric material 14 is attached to a retainer strip 44 with embedded or enclosed wires 46.

The leads 20 are electrically connected to the wires 46. The wires 46 extend to the take-up roller 18 and into a hole 48 defined by the roller 18. The wires are connected to the slip ring connector 50 which is in turn connected to the electrical power storage system 56 (shown in FIG. 11). The carrier fabric material 14 is retained by the left guide track 32 that receives the retainer strip 44.

Figure 9:
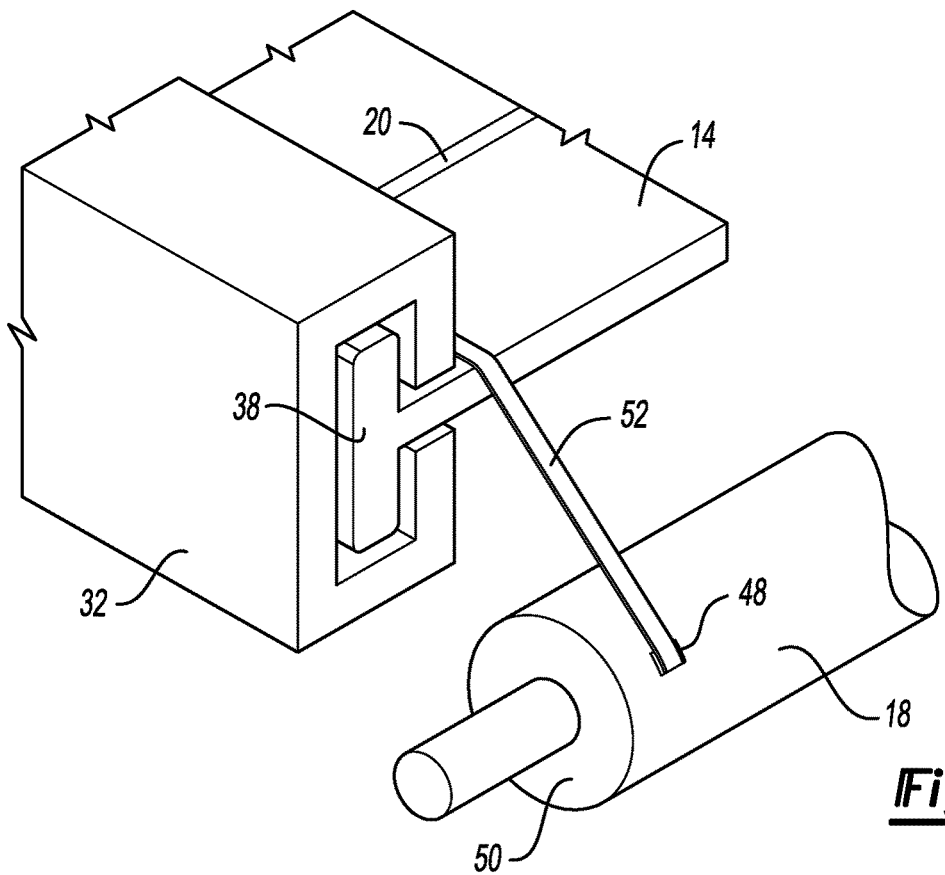
FIG. 9 is a fragmentary perspective view showing a retainer strip having a flat conductor attached to the retainer strip.

Referring to FIG. 9, another embodiment is disclosed wherein a flat conductor 52 is attached to the retainer strip 38. The carrier fabric material 14 is retained by the left guide track 32 that receives the retainer strip 38. The leads from the solar panels 12 are electrically connected to the flat conductor 52. One or more of the flat conductors 52 are routed through the hole 48 in the take-up roller 18 and to the slip ring connector 50 as previously described.

Figure 10:
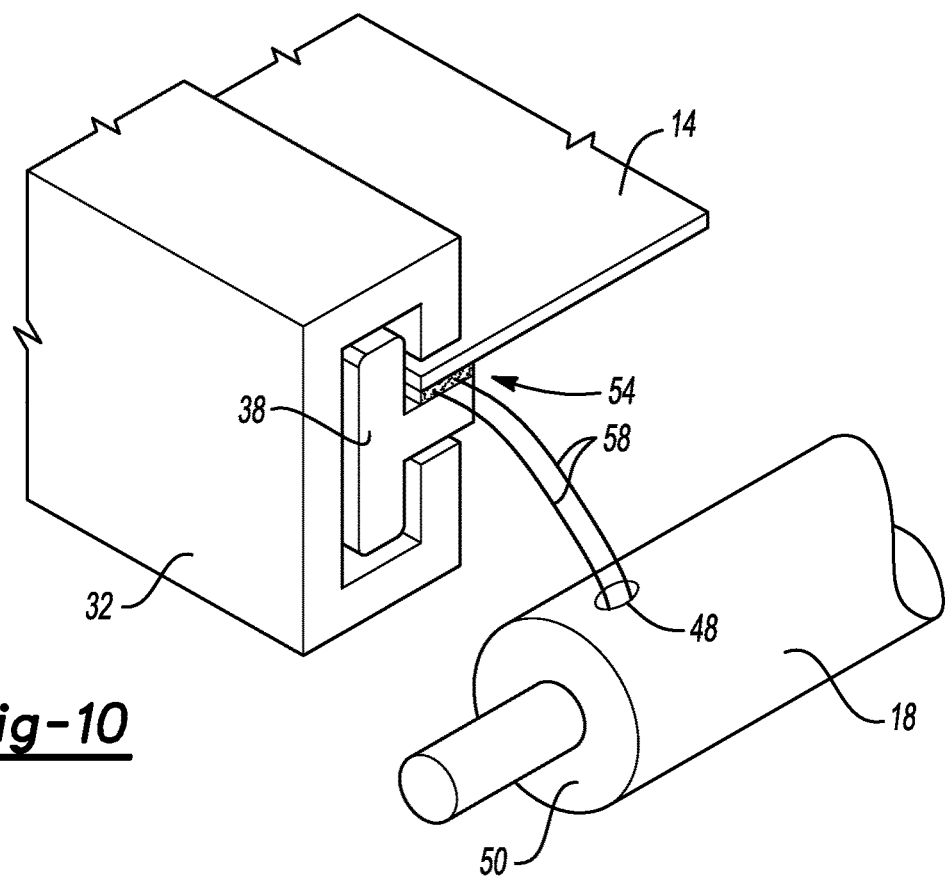
FIG. 10 is a fragmentary perspective view showing a retainer strip having a conductive coating applied to the retainer strip.

Referring to FIG. 10, yet another embodiment is disclosed wherein the conductive coating 54 is applied to the retainer strip 38. The conductive coating material 54 could also be infused or combined with the polymer forming the retainer strip 38. The conductive coating material 54 is connected to wires 58 that conduct current from the conductive coating 54 to the slip ring connector 50 inside the roller through the hole 48 in the take-up roller 18. Current from the leads 20 of the solar panels 12 attached to the carrier fabric material 14 are electrically connected to the conductive coating 54 applied to the retainer strip 38.

Figure 11:
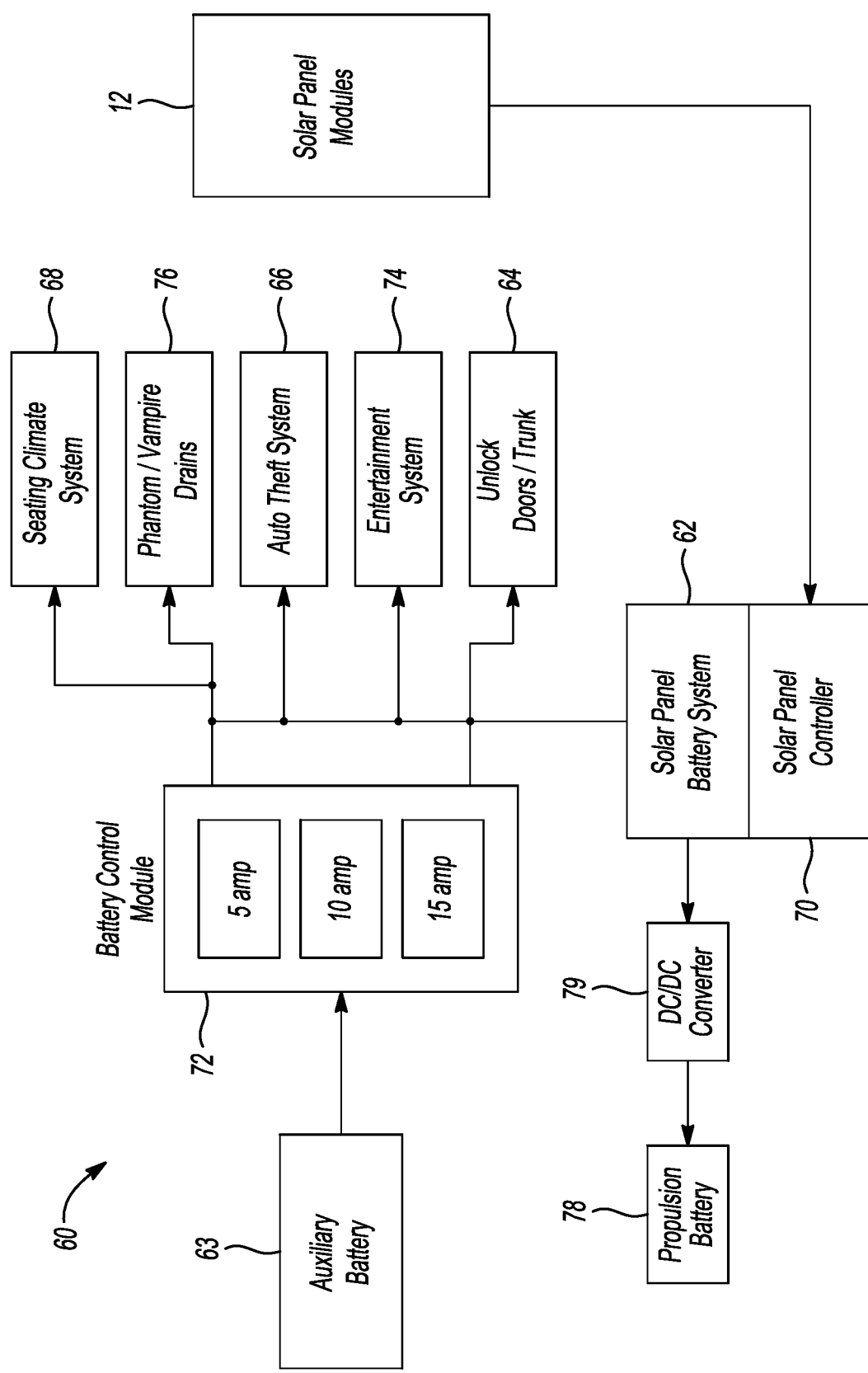
FIG. 11 is a schematic diagram showing the electrical components of the roller shade and solar collector system.

Referring to FIG. 11, a schematic diagram of the solar panel power storage system 60 is provided. The system 60 includes the photovoltaic cells 22 included in at least one laminated solar panel 12 attached to the carrier fabric material 14. Electrical conductors (20, 40, 42, 46, 52 or 54) are attached to the carrier fabric and electrically coupled to the at least one laminated solar panel 12. (shown in FIGS. 1-5)

The solar panel power storage system 60 is provided on the vehicle 10 to receive current from the solar panels 12 through a slip ring connector 50 that is stored in a solar panel battery 62. (shown in FIG. 8) As used herein, references to the solar panel storage system include either a battery or a capacitor system. Electric vehicles 10 may include vehicle power storage systems that include a high voltage propulsion battery 78 and an auxiliary battery 63.

The vehicle 10 may include a door/trunk lock system 64, a vehicle security system 66, and/or a seat thermal management system 68 (generally referred to as "actuated accessories") that are actuated by a user and controlled by a solar panel controller 70. The solar panel controller 70 selectively provides power when actuated by a key fob, telephone, or the like to provide power to the actuated accessories from the solar panel battery 60. The auxiliary battery 63 provides power to a battery control module 72 that modifies the current output to provide the appropriate current level to the actuated accessories and passive systems as described below.

The vehicle 10 may also include an entertainment system 74, memory circuits of accessories, or other phantom/vampire drains 76 that constantly draw a low level of power when the vehicle is parked. (generally referred to as "passive systems"). The solar panel controller 70 provides power to the passive systems from the solar panel power storage system 60.

The solar panel controller may also selectively provide power to a propulsion battery 78 of the vehicle 10. A DC/DC voltage converter 79 may be used to step-up the voltage level of the power provided to the propulsion battery.

Figure 12:
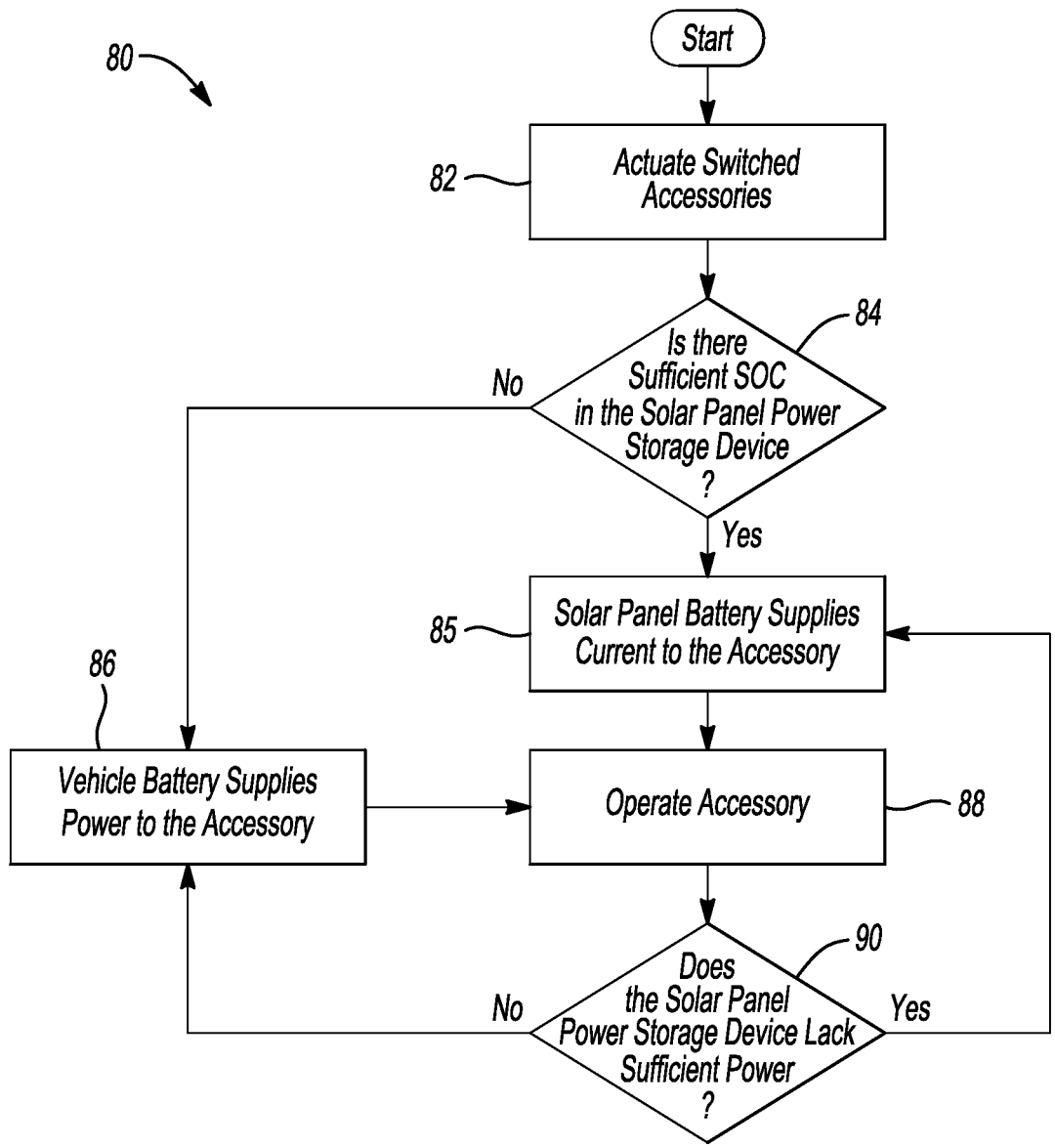
FIG. 12 is a flowchart of the system as used to supply current to actuatable accessories.

Referring to FIGS. 11 and 12, a flow chart is provided of one example of the control system 80 for actuatable accessories. The control system 80 is responsive to an actuation signal received from a switch, possibly from a key fob that communicates wirelessly by blue tooth, cellular system, near field communication, or the like. The actuation signal is received at 82 and the battery state of charge (SOC) is queried at 84 to determine if the solar panel power storage system 70 has sufficient power to operate the selected accessory. If so, the solar panel controller 70 causes the solar panel battery 62 to provide power at 85 to one or more of the selected accessories. If not, the solar panel controller 70 requests power to be provided by the auxiliary vehicle battery 63 used to power accessories of the vehicle in electric vehicles at 86. Electric vehicles generally also include a high voltage battery, or propulsion battery, for moving the vehicle. In conventional internal combustion vehicles, the main battery is requested to provide power instead of the auxiliary battery. The selected actuatable accessory is operated at 88 until switched off or until the SOC of the solar panel power storage system 70 is inadequate to power the accessory. If not, the solar panel controller 70 requests power to be provided by the auxiliary vehicle battery 86. If sufficient power is available from the solar panel controller 70, at 90, the selected accessory will continue to be powered by the solar panel power storage system 70.

Figure 13:
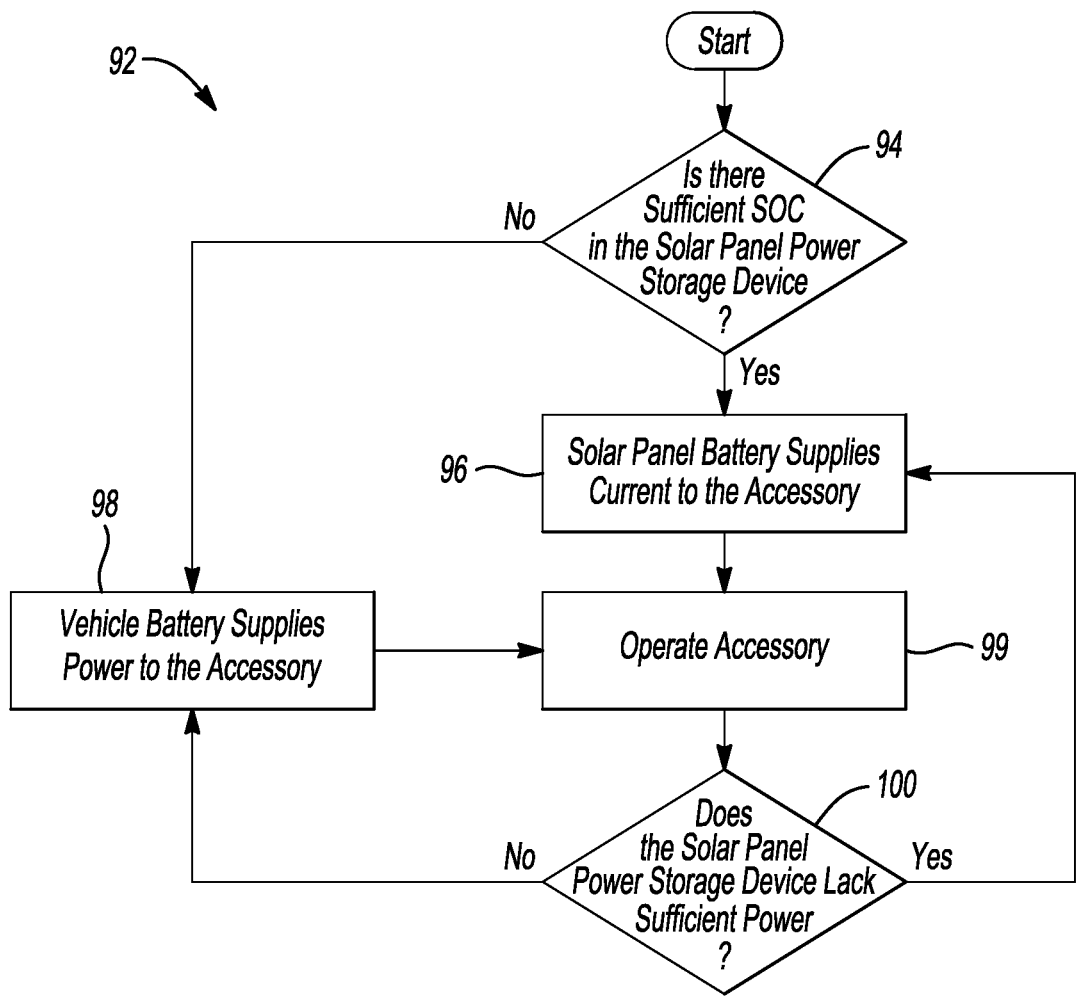
FIG. 13 is a flowchart of the system as used to supply current to passive systems.

Referring to FIGS. 11 and 13, a flow chart is provided of one example of the control system 92 for passive systems. The control system 92 is normally on (possibly in a lower power mode) when the vehicle is parked. The control system at 94 checks state of charge (SOC) of the solar panel battery 62 to determine if the solar panel battery 62 (shown in FIG. 11) has sufficient power to operate the passive systems. If so, at 96 the solar panel controller 70 causes the solar panel battery 62 to provide power to one or more of the passive systems. If not, the solar panel controller 70 requests at 98 that power be provided by the auxiliary vehicle battery 63. Again, in conventional internal combustion vehicles, the main battery is requested to provide power instead of the auxiliary vehicle battery. The passive systems are operated at 100 until the SOC of the solar panel power storage system 70 is inadequate to power the passive systems. If the SOC of the solar panel battery 62 falls below the level required at 100, the solar panel controller 70 requests power to be provided by the auxiliary vehicle battery 63 or another battery of the vehicle. If sufficient power is available from the solar panel battery 62, the passive systems will continue to be powered by the solar panel battery 62.

The embodiments described above are specific examples that do not describe all possible forms of the disclosure. The features of the illustrated embodiments may be combined to form further embodiments of the disclosed concepts. The words used in the specification are words of description rather than limitation. The scope of the following claims is broader than the specifically disclosed embodiments and also includes modifications of the illustrated embodiments.

What is claimed is:

1. A roller shade solar collector for a vehicle comprising:
a roller rotatably attached to the vehicle;
a carrier fabric panel attached on one end to the roller;
right and left guides attached to right and left sides of the carrier fabric panel;
a plurality of solar cells connected in series and attached to the carrier fabric panel;
an electrical power storage system;
electrical leads attached to the carrier fabric and electrically coupled to the solar cells;

electrical conductors provided with at least one of the right and left guides; wherein the electrical conductors are connected through holes on the roller; and at least one connector electrically coupling the electrical conductors to the electrical power storage system.

2. The roller shade solar collector of claim 1 wherein the electrical conductors are wires disposed within at least one of the right and left guides.

3. The roller shade solar collector of claim 2 wherein the electrical conductors are wires embedded in at least one of the right and left guides.

4. The roller shade solar collector of claim 1 wherein the electrical conductors are thin film busbars attached to an outer surface of at least one of the right and left guides.

5. The roller shade solar collector of claim 4 wherein the electrical conductors are conductive material printed on an outer surface of at least one of the right and left guides.

6. The roller shade solar collector of claim 1 wherein the roller is contained in a housing that is attached to the vehicle.

7. The roller shade solar collector of claim 1 wherein the electrical power storage system is independent of a propulsion battery of the vehicle.

8. The roller shade solar collector of claim 1 wherein the solar cells are amorphous silicon solar cells contained in a lamination, wherein the lamination has a thickness of between 0.05 mm and 0.5 mm.

9. The roller shade solar collector of claim 1 wherein the roller is a tube having an outer diameter of between 12 and 20 mm.

10. A roller shade solar collector for a vehicle comprising:
a roller rotatably attached to the vehicle;
a carrier fabric panel attached on one end to the roller;
right and left guides attached to right and left sides of the carrier fabric panel;
a plurality of solar cells connected in series and attached to the carrier fabric panel;
electrical leads attached to the carrier fabric and electrically coupled to the solar cells;
electrical conductors attached to the carrier fabric between the solar cells and at least one of the right and left guides; wherein the electrical conductors are connected through holes on the roller;
an electrical power storage system provided on the vehicle; and
at least one connector disposed on the roller for electrically coupling the electrical conductors to the electrical power storage system.

11. The roller shade solar collector of claim 10 wherein the electrical leads and the electrical conductors are thin film busbars having a flat cross section that are attached to a top surface of the carrier fabric panel.

12. The roller shade solar collector of claim 10 wherein the electrical leads and the electrical conductors are made of a conductive polymer that is adhered to the carrier fabric panel.

13. The roller shade solar collector of claim 10 wherein the at least one connector is a slip ring connector having a first portion fixed to the roller and a second portion fixed to the vehicle.

14. The roller shade solar collector of claim 10 wherein the electrical power storage system provides power to selected accessories when the vehicle is parked.

15. A vehicle comprising:
a roof assembly disposed above a passenger compartment of the vehicle;
a light transmissive panel forming part of the roof assembly;
a roller rotatably attached to the roof assembly; wherein the roller is a tube having an outer diameter of between 12 and 20 mm;
a carrier fabric attached on one end to the roller and having an extended position, wherein the carrier fabric is disposed below the light transmissive panel and a retracted position wherein the carrier fabric is rolled around the roller;
a plurality of solar cells included in at least one laminated solar panel attached to the carrier fabric;
electrical conductors attached to the carrier fabric and electrically coupled to the at least one laminated solar panel;
an electrical power storage system provided on the vehicle; and
connectors electrically coupling the electrical conductors to the electrical power storage system.

16. The vehicle of claim 15 further comprising:
a door lock system; and
a controller operatively connected to the electrical power storage system and the door lock system, wherein the controller provides power collected in the electrical power storage pack to the door lock system when a state of charge of the electrical power storage system is above a predetermined level.

17. The vehicle of claim 15 further comprising:
a security system; and
a controller operatively connected to the electrical power storage system and the security system, wherein the controller provides power collected in the electrical power storage pack to the security system when a state of charge of the electrical power storage system is above a predetermined level.

18. The electric vehicle of claim 15 further comprising:
a seat thermal management system; and
a controller operatively connected to the electrical power storage system and the seat thermal management system, wherein the controller provides power collected in the electrical power storage pack to the security system when a state of charge of the electrical power storage system is above a predetermined level.

19. The vehicle of claim 15 further comprising:
a propulsion battery; and
a controller operatively connected to the electrical power storage system pack selectively provides power to the propulsion battery of the vehicle when a state of charge of the electrical power storage system is above a predetermined level.

20. The vehicle of claim 15 wherein the electrical conductors are thin film busbars.

* * * * *